US009697902B2

(12) United States Patent
Umezawa et al.

(10) Patent No.: US 9,697,902 B2
(45) Date of Patent: Jul. 4, 2017

(54) NONVOLATILE SEMICONDUCTOR MEMORY DEVICE AND DATA PROGRAMMING METHOD FOR MEMORY CELLS

(71) Applicant: Kabushiki Kaisha Toshiba, Minato-ku (JP)

(72) Inventors: Yusuke Umezawa, Kanagawa-ken (JP); Shigeru Kinoshita, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/199,345

(22) Filed: Mar. 6, 2014

(65) Prior Publication Data

US 2015/0055416 A1 Feb. 26, 2015

(30) Foreign Application Priority Data

Aug. 23, 2013 (JP) .................................. 2013-173613

(51) Int. Cl.
*G11C 16/04* (2006.01)
*G11C 16/10* (2006.01)
(Continued)

(52) U.S. Cl.
CPC .......... *G11C 16/10* (2013.01); *G11C 11/5628* (2013.01); *G11C 16/3418* (2013.01); *G11C 16/3436* (2013.01); *G11C 16/30* (2013.01)

(58) Field of Classification Search
CPC .......... G11C 16/10; G11C 16/30; G11C 16/12
(Continued)

(56) References Cited

U.S. PATENT DOCUMENTS 8,638,607 B2 * 1/2014 Sarpatwari ......... G11C 16/0483
365/185.17
8,767,460 B2 * 7/2014 Matsunami ....... H01L 27/11519
365/185.03
(Continued)

FOREIGN PATENT DOCUMENTS

JP 2007-66440 3/2007
JP 2007-87569 A 4/2007
(Continued)

OTHER PUBLICATIONS

Office Action issued Mar. 17, 2016, in Taiwanese Patent Application No. 103128700, with English-language Translation.

*Primary Examiner* — Connie Yoha
(74) *Attorney, Agent, or Firm* — Oblon, McClelland, Maier & Neustadt, L.L.P.

(57) ABSTRACT

According to one embodiment, a nonvolatile semiconductor memory device includes memory cell units, bit lines, word lines, and a controller. Each of the memory cell units includes a plurality of memory cells connected in series. Bit lines are connected respectively to the corresponding memory cell units. Each of the word lines is commonly connected to control gates of the corresponding memory cells of the memory cell units. The controller is configured to control a programming operation of data to the memory cells. The controller is configured to execute a first procedure including programming the data to the memory cell connected to the (4n−3)th (n being a natural number) bit line and the memory cell connected to the (4n−2)th bit line, and a second procedure including programming the data to the memory cell connected to the (4n−1)th bit line and the memory cell connected to the 4nth bit line.

16 Claims, 4 Drawing Sheets

(51) Int. Cl.
*G11C 11/56* (2006.01)
*G11C 16/34* (2006.01)
*G11C 16/30* (2006.01)

(58) Field of Classification Search
USPC .............. 365/185.18, 185.17, 185.24, 5.18
IPC ............................ G11C 16/10,16/30, 16/12
See application file for complete search history.

(56) References Cited

U.S. PATENT DOCUMENTS

| | | | |
|---|---|---|---|
| 8,773,902 B2* | 7/2014 | Dutta | G11C 16/3418 |
| | | | 365/185.02 |
| 8,811,089 B2* | 8/2014 | Ueno | 365/185.22 |
| 2008/0037327 A1* | 2/2008 | Park et al. | 365/185.19 |
| 2008/0279012 A1* | 11/2008 | Lee | 365/185.19 |
| 2011/0013461 A1* | 1/2011 | Shiino | G11C 16/16 |
| | | | 365/185.22 |

FOREIGN PATENT DOCUMENTS

| | | |
|---|---|---|
| JP | 2009-252293 A | 10/2009 |
| JP | 2011-181131 A | 9/2011 |
| JP | 2012-507818 A | 3/2012 |
| TW | 201023188 | 6/2010 |

* cited by examiner

NONVOLATILE SEMICONDUCTOR MEMORY DEVICE AND DATA PROGRAMMING METHOD FOR MEMORY CELLS

CROSS-REFERENCE TO RELATED APPLICATIONS

This application is based upon and claims the benefit of priority from Japanese Patent Application No. 2013-173613, filed on Aug. 23, 2013; the entire contents of which are incorporated herein by reference.

FIELD

Embodiments described herein relate generally to a nonvolatile semiconductor memory device and a data programming method.

BACKGROUND

NAND flash memory is an example of a nonvolatile semiconductor memory device. A memory cell array of NAND flash memory includes memory cell units in which multiple memory cells are connected in series. A bit line and a source line are connected respectively to two ends of each memory cell unit via selection gate transistors. The control gates of the multiple memory cells inside each memory cell unit are connected respectively to different word lines.

In NAND flash memory, the data programming is performed by page unit, with the set of multiple memory cells connected to one word line being used as one page.

Thus, in NAND flash memory, the programming voltage is undesirably applied to the unselected memory cells to which the data is not to be programmed because the unselected memory cells share a word line with the selected memory cells to which the data is to be programmed.

Therefore, a self-boost is performed in which the channel potential of the unselected memory cells is increased due to capacitive coupling by setting the memory cell units including the unselected memory cells to be in the floating state and applying a programming voltage or a pass voltage to the word lines.

In such a case, misprogramming in which the data is programmed also to the unselected memory cells can be suppressed if the channel potential (the boost potential) of the unselected memory cells is increased by the self-boost to be sufficiently high.

However, the boost potential decreases due to the capacitive coupling with the adjacent memory cells. Therefore, when the dimensions between the memory cells decrease as downscaling progresses, there is a risk that the decrease of the boost potential may become pronounced because the capacitive coupling with the adjacent memory cells becomes large. As a result, there is a risk that misprogramming may increase.

DETAILED DESCRIPTION

Figure 1:
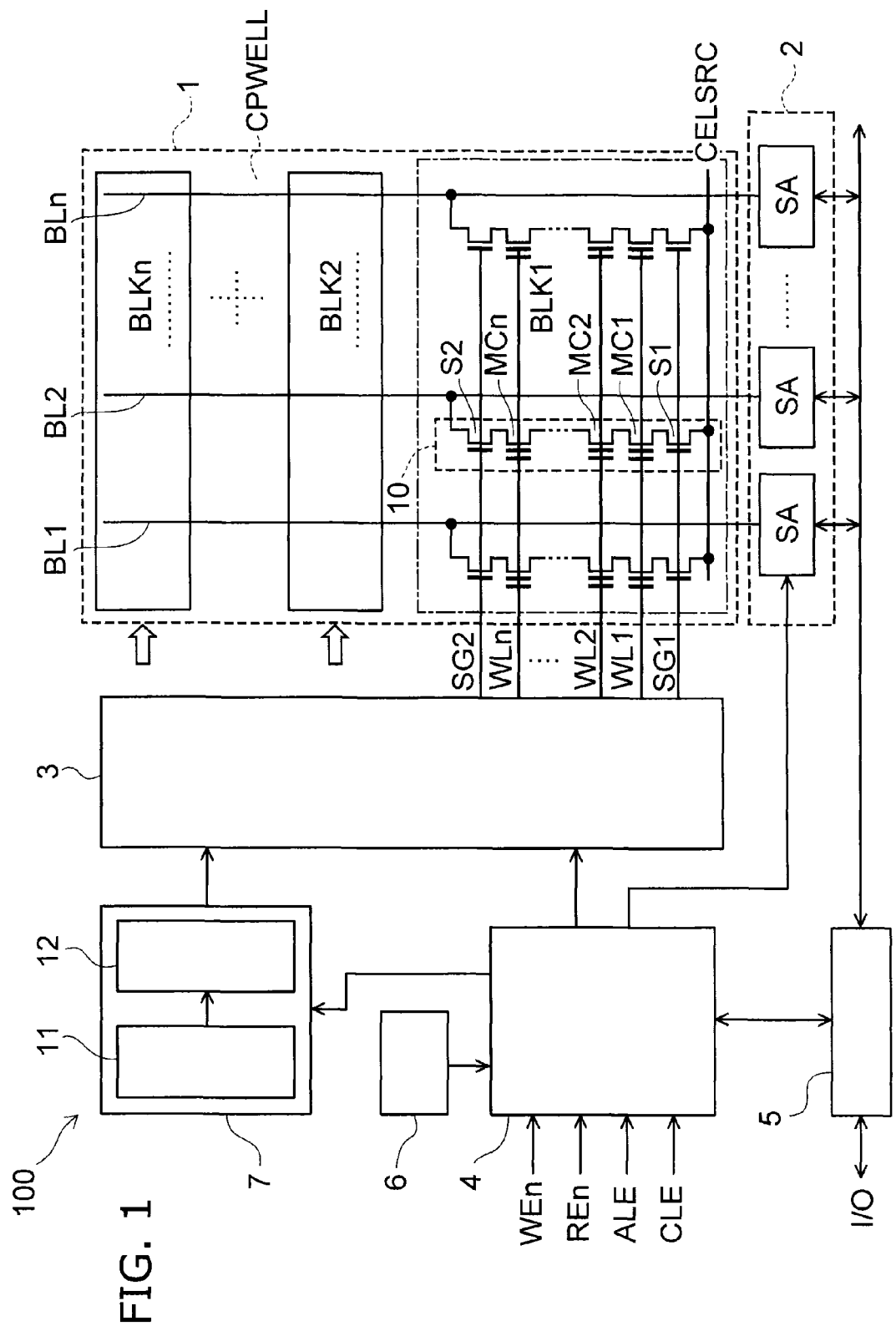
FIG. 1 is a schematic circuit diagram illustrating a nonvolatile semiconductor memory device 100 according to the embodiment.

According to one embodiment, a nonvolatile semiconductor memory device includes a plurality of memory cell units, a plurality of bit lines, a plurality of word lines, and a controller. Each of the plurality of memory cell units includes a plurality of memory cells connected in series. A plurality of bit lines are connected respectively to the corresponding memory cell units. Each of the plurality of word lines is commonly connected to control gates of the corresponding memory cells of the plurality of memory cell units. The controller is configured to control a programming operation of data to the plurality of memory cells. The controller is configured to execute a first procedure including programming the data to the memory cell subjected to programming connected to the (4n−3)th (n being a natural number) bit line and the memory cell subjected to programming connected to the (4n−2)th bit line, and a second procedure including programming the data to the memory cell subjected to programming connected to the (4n−1)th bit line and the memory cell subjected to programming connected to the 4nth bit line.

Various embodiments will be described hereinafter with reference to the accompanying drawings. Similar components in the drawings are marked with like reference numerals, and a detailed description is omitted as appropriate.

FIG. 1 is a schematic circuit diagram illustrating a nonvolatile semiconductor memory device 100 according to the embodiment.

As shown in FIG. 1, the nonvolatile semiconductor memory device 100 according to the embodiment includes a memory cell array 1, a sense amplifier circuit 2, a row decoder 3, a controller 4, an input/output buffer 5, a ROM fuse 6, and a voltage generation circuit 7.

The nonvolatile semiconductor memory device 100 is NAND flash memory.

The memory cell array 1 is formed inside one cell well CPWELL of a silicon substrate.

The memory cell array 1 includes multiple memory cell blocks BLK (BLK1, BLK2, ..., and BLKn). The multiple memory cell blocks BLK are arranged in the direction in which bit lines BL (BL1, BL2, ..., and BLn) extend. The memory cell block BLK is the unit of data erasure.

Each of the multiple memory cell blocks BLK includes multiple memory cell units 10.

The memory cell unit 10 includes multiple memory cells MC (MC1, MC2, ..., and MCn) connected in series in the direction in which the bit lines BL extend. A selection gate transistor S1 is connected to the memory cell MC1. A selection gate transistor S2 is connected to the memory cell MCn.

Figure 6:
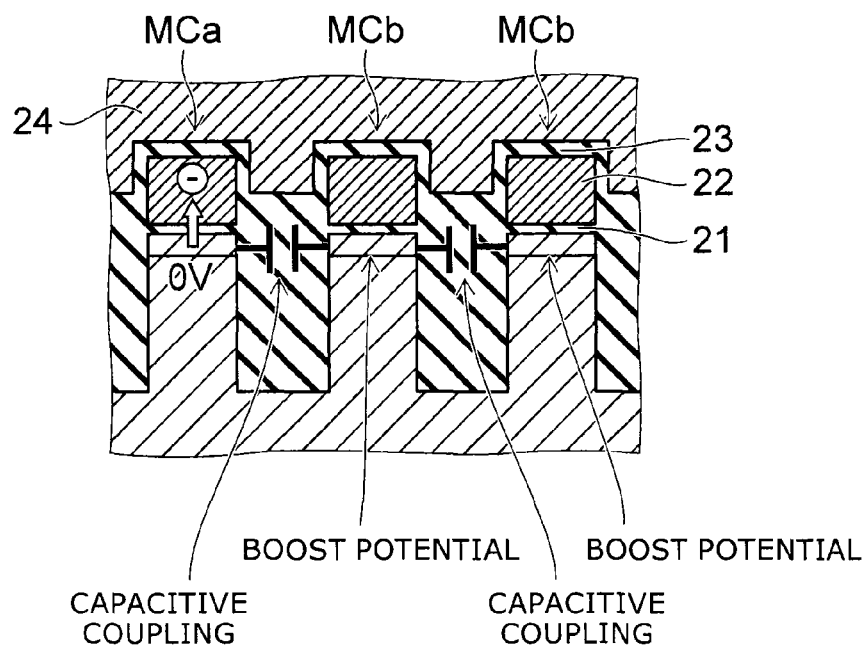
FIG. 6 is a schematic cross-sectional view illustrating the effects of the capacitive coupling with the adjacent memory cells MC.

The memory cell MC includes a gate insulator film (a tunneling insulating film) 21, a floating gate 22 that is provided on the gate insulator film 21, an inter-gate insulating film 23 that is provided on the floating gate 22, and a control gate 24 that is provided on the inter-gate insulating film 23 (referring to, for example, FIG. 6).

The gate insulator film 21 may be formed from, for example, silicon oxide, silicon nitride, etc. The thickness dimension of the gate insulator film 21 may be, for example, about 1 nm (nanometer) to 20 nm.

The floating gate 22 may be formed from, for example, polysilicon, etc. The thickness dimension of the floating gate 22 may be, for example, about 10 nm to 500 nm.

The inter-gate insulating film 23 may be formed from, for example, silicon oxide, silicon nitride, etc. The thickness dimension of the inter-gate insulating film 23 may be, for example, about 2 nm to 30 nm.

The control gate 24 may be formed from, for example, polysilicon, WSi (tungsten silicide), etc. The thickness dimension of the control gate 24 may be, for example, about 10 nm to 500 nm.

Different word lines WL (WL1, WL2, . . . , and WLn) are connected respectively to the control gates 24 of the multiple memory cells MC inside the memory cell unit 10.

The control gate 24 is connected via the word line WL to the control gates 24 of the corresponding memory cells MC of the adjacent memory cell units 10.

The source of the selection gate transistor S1 is connected to a common source line CELSRC. The gate of the selection gate transistor S1 is connected to a selection gate line SG1 provided to be arranged with the word lines WL.

The drain of the selection gate transistor S2 is connected to the bit line BL. The gate of the selection gate transistor S2 is connected to a selection gate line SG2 provided to be arranged with the word lines WL.

Generally, the set of multiple memory cells MC sharing one word line WL are included in one page. However, as described below, in the nonvolatile semiconductor memory device 100 according to the embodiment, there are cases where the bit lines BL to which 0 V (volts) is applied are switched when performing the data programming. Therefore, the set of multiple memory cells MC sharing the one word line WL may be included in two or more multiple pages.

The sense amplifier circuit 2 includes multiple sense amplifiers SA. One sense amplifier SA is connected to one bit line BL.

When reading the data, the sense amplifier SA senses and amplifies the data read via the bit line BL.

When programming the data, the sense amplifier SA applies 0 V (the program data) via the bit line BL.

The sense amplifier circuit 2 includes a not-shown column decoder. The not-shown column decoder selects the sense amplifier SA to be used when reading the data and when programming the data.

The row decoder 3 selects and applies prescribed voltages to the selection gate lines SG1 and SG2 and the word lines WL to be used when reading the data and when programming the data.

The controller 4 performs the controls for the memory cell array 1.

The controller 4 performs the controls for the memory cell array 1 based on, for example, external control signals such as a write enable signal WEn, a read enable signal REn, an address latch enable signal ALE, a command latch enable signal CLE, etc., and the control data stored in the ROM fuse 6.

The controller 4 determines, for example, whether the data that is input is program data or address data. Then, the data that is determined to be program data is transferred to the sense amplifier circuit 2. The data that is determined to be address data is transferred to the row decoder 3 and/or the sense amplifier circuit 2.

The controller 4 performs, for example, the sequential controls, the control of applied voltage, etc., for the erasing operation of the data, the read-out operation of the data, and the programming operation and verify operation of the data.

In such a case, the sequential controls may be performed based on the control data stored in the ROM fuse 6.

The input/output buffer 5 performs the data transfer between the sense amplifier circuit 2 and an external input/output terminal I/O. Also, the input/output buffer 5 receives the data relating to the control, the address data, etc., from the controller 4.

The ROM fuse 6 stores information of the procedures, conditions, etc., of the operations of the nonvolatile semiconductor memory device 100.

The ROM fuse 6 stores, for example, various settings (e.g., sensing times, thresholds, etc.), procedures for the programming operation described below, etc.

The voltage generation circuit 7 includes a voltage step-up circuit 11 and a pulse generation circuit 12.

The voltage step-up circuit 11 generates the programming voltage, the programming intermediate voltage, the erasing voltage, etc., based on the control signal from the controller 4.

The pulse generation circuit 12 converts the voltage generated by the voltage step-up circuit 11 into a pulse voltage.

Namely, the voltage generation circuit 7 generates a programming pulse voltage Vpgm, a programming pulse intermediate voltage Vpass, an erasing pulse voltage Vera, etc.

Operations of the nonvolatile semiconductor memory device 100 will now be described.

Data Erasing Operation

In the nonvolatile semiconductor memory device 100 which is NAND flash memory, the erasing operation of the data is performed by memory cell block BLK.

In the erasing operation of the data, the erasing pulse voltage Vera (about 10 V to 30 V) is applied to the cell well CPWELL. 0 V is applied to all of the word lines WL inside the memory cell block BLK to be erased (the selected memory cell block). Thereby, the charge that is stored in the floating gates 22 of the memory cells MC is discharged to the cell well CPWELL side by a FN tunneling current; and the threshold voltages of the memory cells MC decrease.

Thus, the erasing of the data can be performed.

The selection gate lines SG1 and SG2 are set to be in the floating state so that breakdown of the gate insulator films of the selection gate transistors S1 and S2 does not occur. All of the bit lines BL and the source line CELSRC also are set to be in the floating state.

An erase verify operation may be performed after the erasing operation; and in the case where the erasure of the data is incomplete, the erasing operation may be re-performed.

When performing the erasing operation again, the erasing pulse voltage Vera may be stepped-up by a prescribed value.

Data Read-Out Operation

In the read-out operation of the data, a read-out voltage (e.g., 0 V) is applied to the word line WL connected to the memory cells MC to be read. A read-out pass voltage Vread (e.g., about 3 V to 8 V) is applied to the word lines WL connected to the memory cells MC not to be read.

Then, the sense amplifier circuit 2 senses whether or not current flows in the memory cell units 10 in which the memory cells MC to be read are provided. At this time, if charge is stored in the floating gate 22 of the memory cell MC to be read, a current does not flow because the threshold voltage is high. On the other hand, a current flows if charge is not stored in the floating gate 22 of the memory cell MC to be read (if in the erase state).

Thus, the read-out of the data can be performed.

Data Programming Operation According to a Comparative Example

First, a programming operation of the data according to a comparative example will be described.

In the programming operation of the data according to the comparative example, the programming operation is executed by page unit.

Therefore, in the selected memory cell block, the programming pulse voltage Vpgm (e.g., about 10 V to 25 V) is applied to the word line WL connected to selected memory cells MCa (the memory cells subjected to programming data). The programming pulse intermediate voltage Vpass (e.g., about 5 V to 15 V) is applied to the word lines WL connected to unselected memory cells MCb (the memory cells not subjected to programming data); and a power supply voltage Vdd is applied to the selection gate line SG2.

When programming the data to the selected memory cells MCa, 0 V is applied from the sense amplifier circuit 2 to the bit lines BL connected to the memory cell units 10 in which the selected memory cells MCa are provided. When 0 V is applied to the bit line BL, the selection gate transistor S2 is switched to the on-state; and 0 V is transferred from the bit line BL to the channel of the selected memory cell MCa. Thereby, in the selected memory cell MCa, a high electric field is applied between the channel and the floating gate 22; and charge is injected from the channel into the floating gate 22.

Thus, the data is programmed to the selected memory cells MCa.

On the other hand, self-boost is performed to suppress the programming of the data to the unselected memory cells MCb sharing the word line WL with the selected memory cells MCa, that is, to suppress misprogramming.

The power supply voltage Vdd is applied to the bit line BL connected to the memory cell units 10 in which the unselected memory cells MCb are provided. When the power supply voltage Vdd is applied to the bit line BL, the selection gate transistor S2 is switched to the off-state; and the channel is switched to the floating state.

In such a case, the channel potential increases due to the capacitive coupling with the floating gate 22. Therefore, a high electric field is not applied between the channel and the floating gate 22; and the injection of electrons into the floating gate 22 is suppressed.

Therefore, the programming of the data to the unselected memory cells MCb can be suppressed.

Here, misprogramming can be suppressed if the increase of the channel potential (the boost potential) of the unselected memory cells MCb by the self-boost is sufficiently high.

However, the boost potential decreases due to the capacitive coupling with the adjacent memory cells MC.

Figure 2:
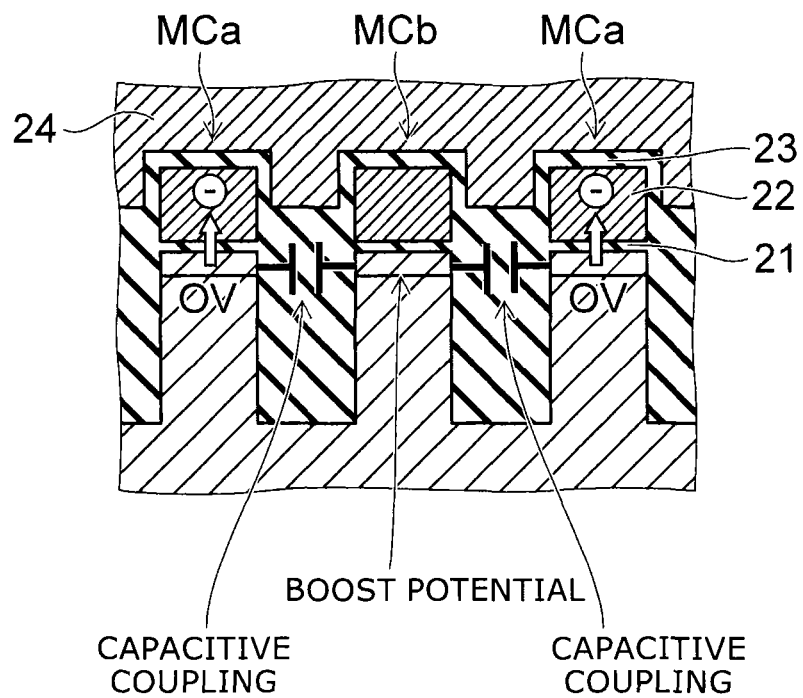
FIG. 2 is a schematic cross-sectional view illustrating the effects of the capacitive coupling with the adjacent memory cells MC.

FIG. 2 is a schematic cross-sectional view illustrating the effects of the capacitive coupling with the adjacent memory cells MC.

The boost potential decreases due to the capacitive coupling with the adjacent memory cells MC.

In such a case, if the selected memory cell MCa is adjacent to the unselected memory cell MCb, the capacitive coupling between the unselected memory cell MCb and the selected memory cell MCa becomes large; and the boost potential of the unselected memory cell MCb decreases further.

In particular, in the case where the two memory cells adjacent to the unselected memory cell MCb are the selected memory cells MCa as shown in FIG. 2, the decrease of the boost potential of the unselected memory cell MCb becomes pronounced.

Therefore, in the case where the two memory cells adjacent to the unselected memory cell MCb are the selected memory cells MCa, misprogramming to the unselected memory cell MCb occurs easily.

Figure 3:
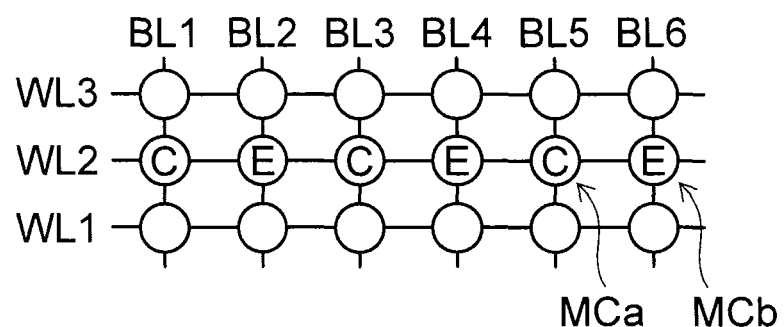
FIG. 3 is a schematic view illustrating the programming pattern of the data.

FIG. 3 is a schematic view illustrating the programming pattern of the data.

In FIG. 3, "C" is the selected memory cell MCa; and "E" is the unselected memory cell MCb.

The programming pattern illustrated in FIG. 3 is the case where the programming of the data is performed for every other one of the multiple memory cells MC connected to the word line WL2.

Figure 4:
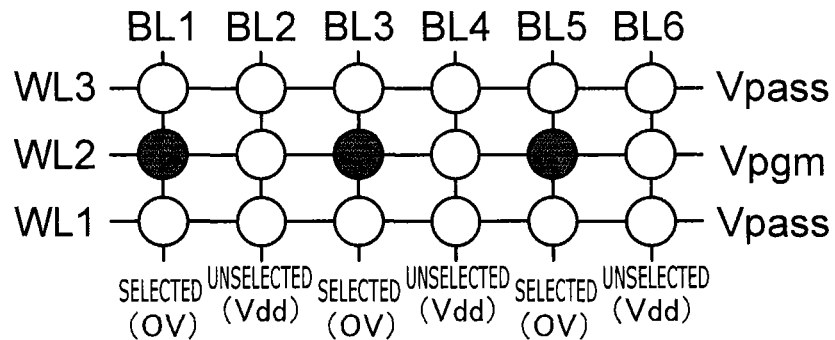
FIG. 4 is a schematic view illustrating the programming operation of the data according to the comparative example.

FIG. 4 is a schematic view illustrating the programming operation of the data according to the comparative example.

FIG. 4 shows the case where the data is programmed simultaneously to the multiple selected memory cells MCa connected to the word line WL2.

In such a case, the programming pulse voltage Vpgm is applied to the word line WL2; and the programming pulse intermediate voltage Vpass is applied to the word lines WL1 and WL3.

Then, 0 V is applied to the bit lines BL1, BL3, and BL5 connected to the memory cell units 10 in which the selected memory cells MCa are provided. Thereby, as described above, in the selected memory cells MCa, a high electric field is applied between the channel and the floating gate 22; and charge is injected from the channel into the floating gate 22.

The power supply voltage Vdd is applied to the bit lines BL2, BL4, and BL6 connected to the memory cell units 10 in which the unselected memory cells MCb are provided. Thereby, as described above, self-boost occurs; and the programming of the data to the unselected memory cells MCb is suppressed.

However, the two memory cells adjacent to the unselected memory cell MCb are the selected memory cells MCa. Therefore, as described above, the decrease of the boost potential of the unselected memory cells MCb becomes pronounced; and misprogramming to the unselected memory cells MCb occurs easily.

Also, as downscaling has progressed in recent years, there is a tendency for the dimensions between the memory cells MC to decrease. Therefore, the effects of the capacitive coupling become even larger; and there is a risk that misprogramming may increase.

Therefore, in the programming operation of the data according to the embodiment, the programming of the data is performed as follows.

Data Programming Operation According to the Embodiment

Figure 5A:
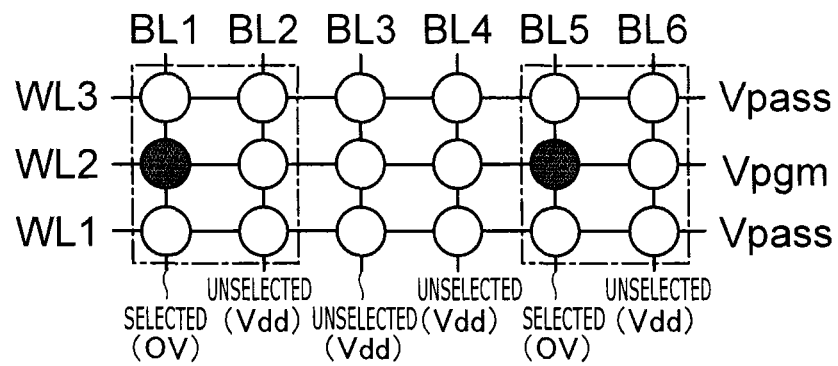
FIGS. 5A and 5B are schematic views illustrating the programming operation of the data according to the embodiment.
Figure 5B:
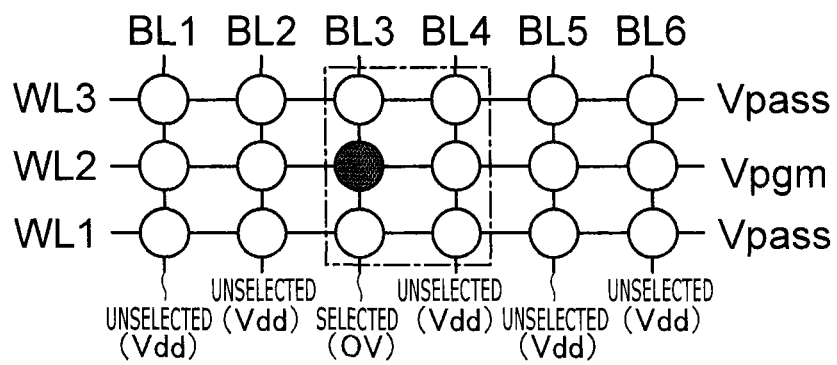

FIGS. 5A and 5B are schematic views illustrating the programming operation of the data according to the embodiment.

FIGS. 5A and 5B show the case where the programming of the data is performed for every other one of the multiple memory cells MC connected to the word line WL2 illustrated in FIG. 3.

This is the case where the data is programmed to the multiple selected memory cells MCa connected to the word line WL2 by being divided into two programmings.

FIG. 6 is a schematic cross-sectional view illustrating the effects of the capacitive coupling with the adjacent memory cells MC.

In the case of the programming operation of the data according to the embodiment as well, the programming pulse voltage Vpgm is applied to the word line WL2; and the programming pulse intermediate voltage Vpass is applied to the word lines WL1 and WL3.

The power supply voltage Vdd is applied to the bit lines BL2, BL4, and BL6 connected to the memory cell units 10 in which the unselected memory cells MCb are provided. Thereby, as described above, the self-boost occurs; and the programming of the data to the unselected memory cells MCb is suppressed.

First, as shown in FIG. 5A, 0 V is applied to the bit lines BL1 and BL5 connected to the memory cell units 10 in which the selected memory cells MCa are provided (corresponding to an example of a first procedure).

At this time, 0 V is not applied to the bit line BL3; and, for example, the power supply voltage Vdd is applied to the bit line BL3.

Thereby, in the selected memory cells MCa connected to the bit lines BL1 and BL5, a high electric field is applied between the channel and the floating gate 22; and charge is injected from the channel into the floating gate 22.

Then, as shown in FIG. 5B, 0 V is applied to the bit line BL3 connected to the memory cell unit 10 in which the selected memory cell MCa is provided (corresponding to an example of a second procedure).

At this time, 0 V is not applied to the bit line BL4; and, for example, the power supply voltage Vdd is applied to the bit line BL4.

Thereby, in the selected memory cell MCa connected to the bit line BL3, a high electric field is applied between the channel and the floating gate 22; and charge is injected from the channel into the floating gate 22.

In other words, in the programming operation of the data according to the embodiment, for the multiple memory cells MC sharing one word line WL, 0 V is not applied to at least one selected from the two memory cells MC adjacent to the unselected memory cell MCb.

Thus, as shown in FIG. 6, the increase of the capacitive coupling between the unselected memory cell MCb and the adjacent memory cells MC can be suppressed.

Therefore, misprogramming to the unselected memory cell MCb can be suppressed because the decrease of the boost potential can be suppressed.

In other words, in the programming operation according to the embodiment, the first procedure including programming the data to the selected memory cell MCa (the memory cell subjected to programming) connected to the (4n−3)th (n being a natural number) bit line BL and the selected memory cell MCa connected to the (4n−2)th bit line BL is executed; and the second procedure including programming the data to the selected memory cell MCa connected to the (4n−1)th bit line BL and the selected memory cell MCa connected to the 4nth bit line BL is executed.

FIGS. 5A and 5B illustrate an example of the case where n is 1 and 2.

The second procedure may be performed after the first procedure or prior to the first procedure.

By performing programming by such procedures, 0 V is not applied to at least one selected from the two adjacent memory cells MC.

Therefore, misprogramming to the unselected memory cell MCb can be suppressed because the decrease of the boost potential can be suppressed.

Here, because the programming is divided into programming the data twice, the time necessary for programming is longer than that of the case where the programming of the data is performed once.

Misprogramming to the unselected memory cell MCb occurs more easily as the programming pulse voltage Vpgm increases.

Therefore, the first procedure and the second procedure may be performed when the programming pulse voltage Vpgm exceeds a predetermined threshold V1. In such a case, the data can be programmed simultaneously to the multiple selected memory cells MCa connected to the common word line WL when the programming pulse voltage Vpgm is not more than the predetermined threshold V1 (corresponding to an example of a third procedure).

Thus, the increase of the time necessary for programming can be suppressed.

The controller 4 executes the first procedure, the second procedure, the third procedure, the application of the programming pulse voltage Vpgm, the application of the programming pulse intermediate voltage Vpass, the application of the power supply voltage Vdd, etc.

For example, there are cases where so-called step-up programming is performed when programming the data.

Figure 7:
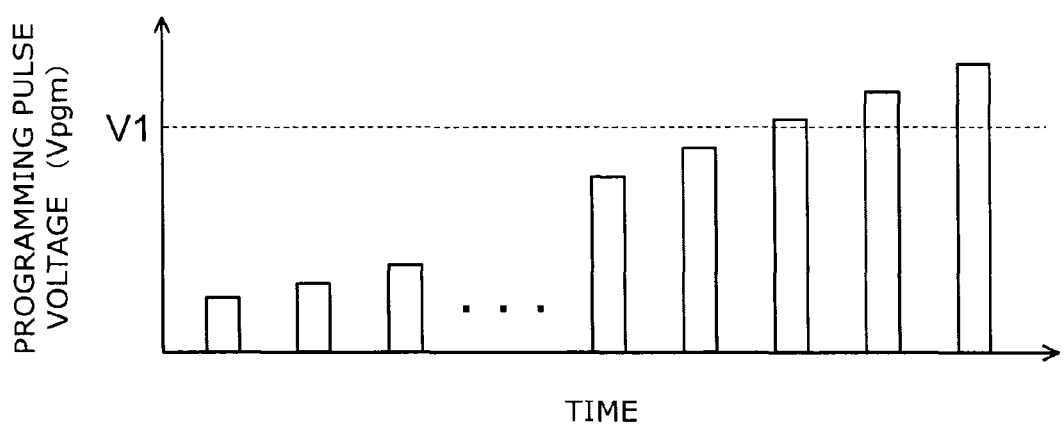
FIG. 7 is a schematic view illustrating step-up programming.

FIG. 7 is a schematic view illustrating step-up programming.

In step-up programming as shown in FIG. 7, a verify read-out (a program verify) operation is performed after the data programming operation to confirm whether or not the data is accurately programmed to the selected memory cell MCa. In the case where it is determined from the result of the verify read-out operation that the data is not programmed to the selected memory cells MCa, an operation of programming only the selected memory cells MCa determined to have not been programmed is performed by increasing (stepping-up) the programming pulse voltage Vpgm in stages; the verify read-out operation is performed; and these operations are repeated.

At this time, 0 V is not applied to the bit lines BL of the selected memory cells MCa determined to have been programmed; and, for example, the power supply voltage Vdd is applied to these bit lines BL. Thus, the selected memory cells MCa determined to have been programmed are no longer subjected to programming.

The step-up programming is executed by the controller 4.

In such a case, the first procedure and the second procedure are performed when the programming pulse voltage Vpgm exceeds the predetermined threshold V1. When the programming pulse voltage Vpgm is not more than the predetermined threshold V1, the data may be programmed simultaneously to the multiple selected memory cells MCa connected to the common word line WL.

Thus, the increase of the time necessary for programming can be suppressed.

There are cases where multi-bit data is programmed to the selected memory cell MCa.

For example, there are cases where two bits of data are programmed to one selected memory cell MCa by controlling four different values of the threshold voltage.

Two subpages (an upper page and a lower page) are formed in the case where two bits of data are programmed.

Then, a programming procedure of the lower page data using a programming pulse voltage Vpgm1 (corresponding to an example of a first programming voltage) is executed; and a programming procedure of the upper page data using a programming pulse voltage Vpgm2 (corresponding to an example of a second programming voltage) that is higher than the programming pulse voltage Vpgm1 is executed.

The programming of the multi-bit data is executed by the controller 4.

In such a case, the first procedure and the second procedure may be performed when the programming pulse voltage Vpgm2 of the upper page data exceeds the prescribed threshold.

When the programming pulse voltage Vpgm2 of the upper page data is not more than the prescribed threshold V1, the data may be programmed simultaneously to the multiple selected memory cells MCa connected to the common word line WL.

Thus, the increase of the time necessary for programming can be suppressed.

Also, the first procedure and the second procedure may be performed when the programming pulse voltage Vpgm2 of the lower page data exceeds the prescribed threshold.

When the programming pulse voltage Vpgm2 of the lower page data is not more than the prescribed threshold V1, the data may be programmed simultaneously to the multiple selected memory cells MCa connected to the common word line WL.

Thus, the increase of the time necessary for programming can be suppressed.

The threshold V1 is affected by the dimensions between the memory cells MC.

For example, the threshold V1 decreases as the dimensions between the memory cells MC decrease (the downscaling progresses).

The dimensions between the memory cells MC fluctuate easily due to the fluctuation of the process conditions, etc.

Therefore, in the nonvolatile semiconductor memory device 100, the programming pulse voltage at which misprogramming occurs may be determined beforehand; and the threshold V1 may be determined based on the result. In such a case, the information relating to the procedures and conditions (e.g., the threshold V1, etc.) of the programming operation of the data according to the embodiment is stored in the ROM fuse 6 as the control data.

Then, the controller 4 controls the programming operation of the data based on the control data stored in the ROM fuse 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising: a plurality of memory cell units, each of the plurality of memory cell units including a plurality of memory cells connected in series; a plurality of bit lines connected respectively to the corresponding memory cell units; a plurality of word lines, each of the plurality of word lines being commonly connected to control gates of the corresponding memory cells of the plurality of memory cell units; and a controller configured to control a programming operation of data to the plurality of memory cells, the controller being configured to execute when programming the data to the memory cell subjected to programming connected to four bit lines provided side by side, programming the data being performed every adjacent two bit lines in two programmings, a first procedure including programming the data to the memory cell subjected to programming connected to the (4n−3)th (n being a natural number) bit line and the memory cell subjected to programming connected to the (4n−2)th bit line, and a second procedure including programming the data to the memory cell subjected to programming connected to the (4n−1)th bit line, and the controller being configured to apply 0 (zero) V to the (4n-3)th bit line in the first procedure and apply a power supply voltage to the (4n-2)th bit line in the first procedure, wherein the controller is configured to apply a programming voltage to the word line connected to the memory cells subjected to programming, and wherein the controller also is capable of implementing a third procedure including programming the data simultaneously to a plurality of the memory cells subjected to programming connected to a common word line, the controller is configured to execute the third procedure when the programming voltage is not more than a prescribed threshold, and the controller is configured to execute the first procedure and the second procedure when the programming voltage exceeds the prescribed threshold.

2. The device according to claim 1, wherein the controller is configured to increase the programming voltage in stages.

3. The device according to claim 1, wherein the controller is configured to execute a programming procedure for lower page data using a first programming voltage and a programming procedure for upper page data using a second programming voltage, the second programming voltage being higher than the first programming voltage.

4. The device according to claim 3, wherein
the controller also is capable of implementing a third procedure including programming the data simultaneously to a plurality of the memory cells subjected to programming connected to a common word line,
the controller is configured to execute the third procedure when the second programming voltage is not more than a prescribed threshold, and
the controller is configured to execute the first procedure and the second procedure when the second programming voltage exceeds the prescribed threshold.

5. The device according to claim 1, wherein the controller is configured to apply 0 (zero) V to the (4n−1)th bit line in the second procedure and apply a power supply voltage to the (4n)th bit line in the first procedure.

6. The device according to claim 1, further comprising a ROM fuse configured to store information relating to the first procedure and the second procedure,
the controller being configured to execute the first procedure and the second procedure based on the information stored in the ROM fuse.

7. The device according to claim 4, further comprising a ROM fuse configured to store information relating to the first procedure and the second procedure,
the ROM fuse being further configured to store information relating to the third procedure, and
the controller being configured to execute the third procedure based on the information stored in the ROM fuse.

8. A data programming method of a nonvolatile semiconductor memory device, the device including:
a plurality of memory cell units, each of the plurality of memory cell units including a plurality of memory cells connected in series;
a plurality of bit lines connected respectively to the corresponding memory cell units;

a plurality of word lines, each of the plurality of word lines being commonly connected to control gates of the corresponding memory cells of the plurality of memory cell units; and a controller configured to control a programming operation of data to the plurality of memory cells, the method comprising:

when programming the data to the memory cell subjected to programming connected to four bit lines provided side by side, programming the data being performed every adjacent two bit lines in two programmings, executing a first procedure by the controller including programming the data to the memory cell subjected to programming connected to the (4n−3)th (n being a natural number) bit line and the memory cell subjected to programming connected to the (4n−2)th bit line; and executing a second procedure by the controller including programming the data to the memory cell subjected to programming connected to the (4n−1)th bit line and the memory cell subjected to programming connected to the 4nth bit line, and 0 (zero) V being applied to the (4n−3)th bit line by the controller in the first procedure, and a power supply voltage being applied to the (4n−2)th bit line by the controller in the first procedure, wherein a programming voltage is applied by the controller to the word line connected to the memory cells subjected to programming and wherein a third procedure also is implementable by the controller, the third procedure including programming the data simultaneously to a plurality of the memory cells subjected to programming connected to a common word line, the third procedure is executed by the controller when the programming voltage is not more than a prescribed threshold, and the first procedure and the second procedure are executed by the controller when the programming voltage exceeds the prescribed threshold.

9. The method according to claim 8, wherein the programming voltage is increased in stages by the controller.

10. The method according to claim 8, wherein a programming procedure for lower page data using a first programming voltage and a programming procedure for upper page data using a second programming voltage are executed by the controller, the second programming voltage being higher than the first programming voltage.

11. The method according to claim 10, wherein a third procedure also is implementable by the controller, the third procedure including programming the data simultaneously to a plurality of the memory cells subjected to programming connected to a common word line, the third procedure is executed by the controller when the second programming voltage is not more than a prescribed threshold, and the first procedure and the second procedure are executed by the controller when the second programming voltage exceeds the prescribed threshold.

12. The method according to claim 8, wherein 0 (zero) V is applied to the (4n−1)th bit line by the controller in the second procedure, and a power supply voltage is applied to the (4n)th bit line by the controller in the first procedure.

13. The method according to claim 8, wherein the nonvolatile semiconductor memory device further includes a ROM fuse configured to store information relating to the first procedure and the second procedure, and the first procedure and the second procedure are executed by the controller based on the information stored in the ROM fuse.

14. The method according to claim 11, wherein the nonvolatile semiconductor memory device further includes a ROM fuse configured to store information relating to the first procedure and the second procedure, the ROM fuse is further configured to store information relating to the third procedure, and the third procedure is executed by the controller based on the information stored in the ROM fuse.

15. A nonvolatile semiconductor memory device, comprising: a plurality of memory cell units, each of the plurality of memory cell units including a plurality of memory cells connected in series; a plurality of bit lines connected respectively to the corresponding memory cell units; a plurality of word lines, each of the plurality of word lines being commonly connected to control gates of the corresponding memory cells of the plurality of memory cell units; and a controller configured to control a programming operation of data to the plurality of memory cells, the controller being configured to execute when programming the data to the memory cell subjected to programming connected to four bit lines provided side by side, programming the data being performed every adjacent two bit lines in twice, a first procedure including programming the data to the memory cell subjected to programming connected to the (4n-3)th (n being a natural number) bit line and the memory cell subjected to programming connected to the (4n-2)th bit line, and a second procedure including programming the data to the memory cell subjected to programming connected to the (4n-l)th bit line and the memory cell subjected to programming connected to the 4nth bit line, and the controller being configured to apply 0 (zero) V to the (4n-l)th bit line in the second procedure and apply a power supply voltage to the (4n)th bit line in the first procedure, wherein a programming voltage is applied by the controller to the word line connected to the memory cells subjected to programming and wherein a third procedure also is implementable by the controller, the third procedure including programming the data simultaneously to a plurality of the memory cells subjected to programming connected to a common word line, the third procedure is executed by the controller when the programming voltage is not more than a prescribed threshold, and the first procedure and the second procedure are executed by the controller when the programming voltage exceeds the prescribed threshold.

16. A data programming method of a nonvolatile semiconductor memory device, the device including: a plurality of memory cell units, each of the plurality of memory cell units including a plurality of memory cells connected in series; a plurality of bit lines connected respectively to the corresponding memory cell units; a plurality of word lines, each of the plurality of word lines being commonly connected to control gates of the corresponding memory cells of the plurality of memory cell units; and a controller configured to control a progamming operation of data to the plurality of memory cells, the method comprising: when programming the data to the memory cell subjected to programming connected to four bit lines provided side by side, programming the data being performed every adjacent two bit lines in twice, executing a first procedure by the controller including programming the data to the memory cell subjected to programming connected to the (4n-3)th (n being a natural number) bit line and the memory cell subjected to programming connected to the (4n-2)th bit line; and executing a second procedure by the controller including programming the data to the memory cell subjected to programming connected to the (4n-l)th bit line and the memory cell subjected to programming connected to the 4nth bit line, and 0 (zero) V being applied to the (4n-l)th bit line by the controller in the second procedure, and a power supply voltage being applied to the (4n)th bit line by the controller in the first procedure, wherein a programming voltage is applied by the controller to the word line connected to the memory cells subjected to programming and wherein a third procedure also is implementable by the controller, the third procedure including programming the data simultaneously to a plurality of the memory cells subjected to programming connected to a common word line, the third procedure is executed by the controller when the programming voltage is not more than a prescribed threshold, and the first procedure and the second procedure are executed by the controller when the programming voltage exceeds the prescribed threshold.

* * * * *